United States Patent
Chae et al.

(10) Patent No.: US 8,378,869 B2
(45) Date of Patent: Feb. 19, 2013

(54) FAST DATA WEIGHTED AVERAGE CIRCUIT AND METHOD

(75) Inventors: Jeongseok Chae, Carlsbad, CA (US); Gábor C. Temes, Corvallis, OR (US)

(73) Assignee: Asahi Kasei Microdevices Corporation, Tokyo (JP)

( * ) Notice: Subject to any disclaimer, the term of this patent is extended or adjusted under 35 U.S.C. 154(b) by 18 days.

(21) Appl. No.: 13/233,403

(22) Filed: Sep. 15, 2011

(65) Prior Publication Data

US 2012/0068865 A1 Mar. 22, 2012

Related U.S. Application Data

(60) Provisional application No. 61/383,818, filed on Sep. 17, 2010.

(51) Int. Cl.
*H03M 3/00* (2006.01)
(52) U.S. Cl. ........ 341/143; 375/260; 375/355; 341/155; 341/145; 341/140
(58) Field of Classification Search .......... 341/140–160; 375/260, 355
See application file for complete search history.

(56) References Cited

U.S. PATENT DOCUMENTS

| | | | | |
|---|---|---|---|---|
| 5,043,799 A | * | 8/1991 | Kohiyama et al. | 348/498 |
| 6,266,002 B1 | * | 7/2001 | Gong et al. | 341/150 |
| 7,486,210 B1 | * | 2/2009 | Hong et al. | 341/60 |
| 7,916,058 B1 | * | 3/2011 | Balachandran | 341/144 |

OTHER PUBLICATIONS

Vleugels, Katelijn et al., "A 2.5-V Sigma-Delta Modulator for Broadband Communications Applications", IEEE Journal of Solid State Circuits, Dec. 2001, pp. 1887-1899, vol. 36, No. 12.
Zhenyong, Zhang et al., "A Segmented Data-Weighted-Averaging Technique", IEEE, 2007, pp. 481-484.
Silva, J. et al., "Wideband Low-Distortion Delta-Sigma ADC Topology", Electronics Letters, Jun. 7, 2001, pp. 737-738, vol. 37, No. 12.

* cited by examiner

*Primary Examiner* — Lam T Mai
(74) *Attorney, Agent, or Firm* — Maine Cernota & Rardin

(57) ABSTRACT

A method and apparatus are provided for Fast Data Weighted Average (DWA) double-sampling modulators with minimal loop delay supporting improved stability. Quantization and DEM are accomplished within non-overlap time. By this reduction in time delay, power can be saved for analog integrators. The DC signal of partitioned DWA is removed by alternating reference voltages, and there is no additional delay as the alternation is performed at the comparator inputs. Embodiments employ an oversampling ratio (OSR) of 8 and a 15-level quantizer.

20 Claims, 6 Drawing Sheets

FAST DATA WEIGHTED AVERAGE CIRCUIT AND METHOD

RELATED APPLICATIONS

This application claims the benefit of U.S. Provisional Application No. 61/383,818, filed Sep. 17, 2010; this application is herein incorporated in its entirety by reference.

FIELD OF THE INVENTION

The invention relates to architectures for double-sampling delta sigma modulators, particularly to a fast data weighted average implementation of dynamic element matching which has good tonal behavior with small signal inputs.

BACKGROUND OF THE INVENTION

A broad range of products incorporate analog to digital and digital to analog converters. Performance expectations of these products are constantly driving designs to achieve greater linearity and bandwidth while limiting or reducing power consumption. Oversampling delta sigma ($\Delta\Sigma$) modulators with feedback support analog-to-digital (A/D) and digital to analog (D/A) architectures to meet these needs. Oversampling converters offer lower power consumption and complexity than pipelined A/D converters. However, technology imposes limits on the oversampling ratio (OSR). A consequence is that when the OSR is low, and resolution and bandwidth need to be high, multibit quantization is needed with oversampling modulators. However, mismatch-induced errors in multibit digital to analog converters (DAC)s for multibit quantization can be the driver limiting the spurious-free dynamic range (SFDR). In order to match the SFDR of the modulator's linearity, linearization techniques are used. Dynamic element matching is one of these. Dynamic element matching (DEM) is a process of dynamically selecting the unit elements of a multilevel DAC to produce an output level corresponding to a digital code. Although dynamic element matching increases chip area and complexity, the increases are relatively small. Dynamic element matching employs the averaging intrinsic to oversampling modulators to decorrelate mismatch-induced DAC errors from the input signal and move noise power out of the signal band. Several algorithms exist to dynamically select the unit elements. One of the DEM techniques is data weighted average (DWA). It is not only used to shuffle, but also applied to filter the DAC mismatch error out of the signal band by using a scrambler to change the connections of the thermometer coded quantizer outputs before they are applied on the feedback DAC. However, for delta sigma modulators at slow input signal, the DWA algorithm generates strong in-band signal-dependent tones that degrade the signal-to-noise-plus-distortion ratio (SNDR).

A variation of the DWA algorithm is the partitioned DWA (P-DWA). The P-DWA algorithm is based on DWA; it decreases the delay of DEM circuitry, but at the cost of an increase in inband tones. For the P-DWA algorithm, the multibit DAC is divided into two partitions, each containing half of the unit elements. DWA is performed independently within each partition to determine which set of unit elements in each partition is selected to generate a DAC output. To obtain the digital input codes for each of the partitions, the overall digital input (which encodes the desired output level as a thermometer code) is split into two equal parts. The even bits of the digital input are used as the inputs to the first partition, and the odd bits are allocated to the second partition. A concern in the case of P-DWA is the effect of systematic mismatch among the average capacitor values in the two partitions. If this mismatch becomes linearly increased compared to the mismatch between the unit elements within each partition, in-band tones are added to the overall in-band quantization noise power. While the P-DWA algorithm can reduce the time delay by half, it increases in-band tones and generates a DC signal.

FIG. 1 is a fully differential switched-capacitor implementation of the fifth-order cascaded delta sigma ($\Sigma\Delta$) modulator integrated in CMOS technology. As noted previously, because of the noise shaping provided by each stage in this architecture, the circuits in the first stage are subject to the most stringent requirements. This section therefore stage, with special consideration given to the difficulties encountered in the design for operation from a low supply voltage.

FIG. 2 is a DWA circuit from Zhang, Z., and Temes, G. C., 'A Segmented Data-Weighted-Averaging Technique', ISCAS, May 2007, New Orleans, pp. 481-484. While displaying limitations, it provides good tonal behavior in a P-DWA circuit device (102 in FIG. 1) comprising at least two inputs of multiplexer (MUX) provided signals from analog-to-digital converter (as quantizer) 101 in FIG. 1; at least two MUXs; at least two inputs per shifter, selecting between the signals of at least a first input of MUXs and the signals of at least a second input of MUXs providing inputs to a DAC 103 (and 104, 105) in FIG. 1; at least two pointer generator, generating a rotation pointer indicating where each input should be rotated during the next cycle, whereby outputs of the plurality of shifters direct to a plurality of outputs, whereby non-overlap alternation of the signals of the at least a first shifter block and the at least a second shifter block with double sampling quantization and DEM removes DC components but increases instability by introducing the additional loop delay of MUXs.

FIG. 3 is a 4-bit DWA circuit containing a pointer generator and a shifter. The pointer generator generates the rotation pointer indicating where each input bit, q(3)-q(0), should be rotated during the next clock cycle. The shifter rotates each input bit to the proper position through the binary-weighted control code sh(1)-sh(0). In some DWA implementations, instead of a shifter, a coder is used to directly map the quantizer output bits through the MUX to the DAC inputs d(3)-d(0), but this implementation is slower than the shifter-based one. Also, such coder-based DWA system introduces more loop delay in a continuous-time DSM, making it less stable. In an SC realization, settling errors are introduced in the integrating phase. Hence, shifter-based DWA implementation is often preferred.

Each of these approaches has consequences such as loop delay; stability impacts, DC signals and notable power consumption. What is needed are techniques for a double-sampling $\Delta\Sigma$ modulator architecture giving improved performance without increasing power consumption.

SUMMARY OF THE INVENTION

Embodiments include a fast data weighted average circuit device comprising an analog-to-digital converter (ADC) comprising a plurality of comparators; a data weighted average circuit comprising a shifter; wherein at least one of the plurality of comparators comprises an input signal and at least two switches per the at least one comparator, the at least two switches selecting between signals of at least a first block providing first reference voltages and signals of at least a second block providing second reference voltages as inputs to the plurality of comparators, based on a timing signal; wherein the shifter shifts the outputs of the plurality of comparators with n-gate delays, based on the timing signal, wherein the outputs of the plurality of comparators randomly direct to a plurality of outputs; wherein non-overlap alternation of the signals of the at least a first block and the at least a second block comprises double sampling quantization. For other embodiments, the shifter comprises shifting the outputs of the plurality of comparators with 3-gate delays; and the outputs of the plurality of comparators randomly direct to a plurality of even outputs and a plurality of odd outputs. In additional embodiments, the timing signal comprises Φ1 and Φ2; and the outputs of the plurality of comparators randomly direct to a plurality of outputs based on a Partitioned-Data Weighted Average (P-DWA) algorithm. More embodiments include that the shifter comprises a plurality of switches; and the shifter rotates each the comparator input to a proper position through a binary-weighted control code and selects paths randomly based on a P-DWA algorithm.

Another embodiment includes a delta sigma modulator comprising an integrator; a fast data weighted average circuit device; and a digital-to-analog converter (DAC); wherein the fast data weighted average circuit device comprises an analog-to-digital converter (ADC) comprising a plurality of comparators; a data weighted average circuit comprising a shifter; and wherein the comparator comprises an input signal from the integrator and at least two switches per the comparator, the switches selecting between signals of at least a first block providing first reference voltages and signals of at least a second block providing second reference voltages as inputs to the plurality of comparators, based on timing signal; wherein the shifter shifts the outputs of the plurality of comparators with n-gate delays, based on the timing signal, wherein the outputs of the plurality of comparators randomly direct to a plurality of outputs, wherein the plurality of outputs provided to the DAC, wherein non-overlap alternation of the signals of the at least a first block and the at least a second block with double sampling quantization.

A further embodiment provides a fast data weighted average circuit device comprising at least two switches per comparator, selecting between signals of at least a first block and signals of at least a second block providing reference voltages as inputs to a plurality of the comparators; and a critical path comprising a three-gate delay, whereby outputs of the plurality of comparators direct to a plurality of outputs, whereby non-overlap alternation of the signals of the at least a first block and the at least a second block with double sampling quantization and Dynamic Element Matching (DEM) removes DC components and maintains stability without introducing additional phase for the loop delay. For other embodiments, the outputs of the plurality of comparators randomly direct to a plurality of even outputs and a plurality of odd outputs; and a timing signal comprises Φ1 and Φ2. In additional embodiments, the outputs of the plurality of comparators randomly direct to a plurality of outputs based on a Partitioned-Data Weighted Average (P-DWA) algorithm; and a shifter comprises a plurality of switches. More embodiments include that the shifter rotates each the comparator input to a proper position through a binary-weighted control code and selects paths randomly based on a Partitioned-Data Weighted Average (P-DWA) algorithm.

Yet another embodiment provides a method for fast data weighted average in a delta sigma modulator, the method comprising the steps of selecting at least a first block; providing signal of the at least a first block to input of comparators; selecting at least a second block; and providing signal of the at least a second block to input of the comparators, wherein non-overlap alternation of double sampling quantization and Dynamic Element Matching (DEM) removes DC components and maintains stability without introducing additional phase for the loop delay. For other embodiments, the method comprises the step of shifting, by a shifter, outputs of the comparators with 3-gate delays; and the step of randomly directing outputs of the comparators to a plurality of even outputs and a plurality of odd outputs. In additional embodiments, the method comprises a timing signal comprising Φ1 and Φ2; and the step of randomly directing outputs of the comparators to a plurality of outputs based on a Partitioned-Data Weighted Average (P-DWA) algorithm. Still more embodiments include the step of rotating each the comparator input by a shifter to a proper position through a binary-weighted control code; and selecting paths randomly based on a partitioned-data weighted average (P-DWA) algorithm.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The following detailed description provides example embodiments of the presently claimed invention with references to the accompanying drawings. The description is intended to be illustrative and not limiting the scope of the present invention. Embodiments are described in sufficient detail to enable one of ordinary skill in the art to practice the subject invention. Other embodiments may be practiced with some variations without departing from the spirit or scope of the subject invention.

Figure 1:
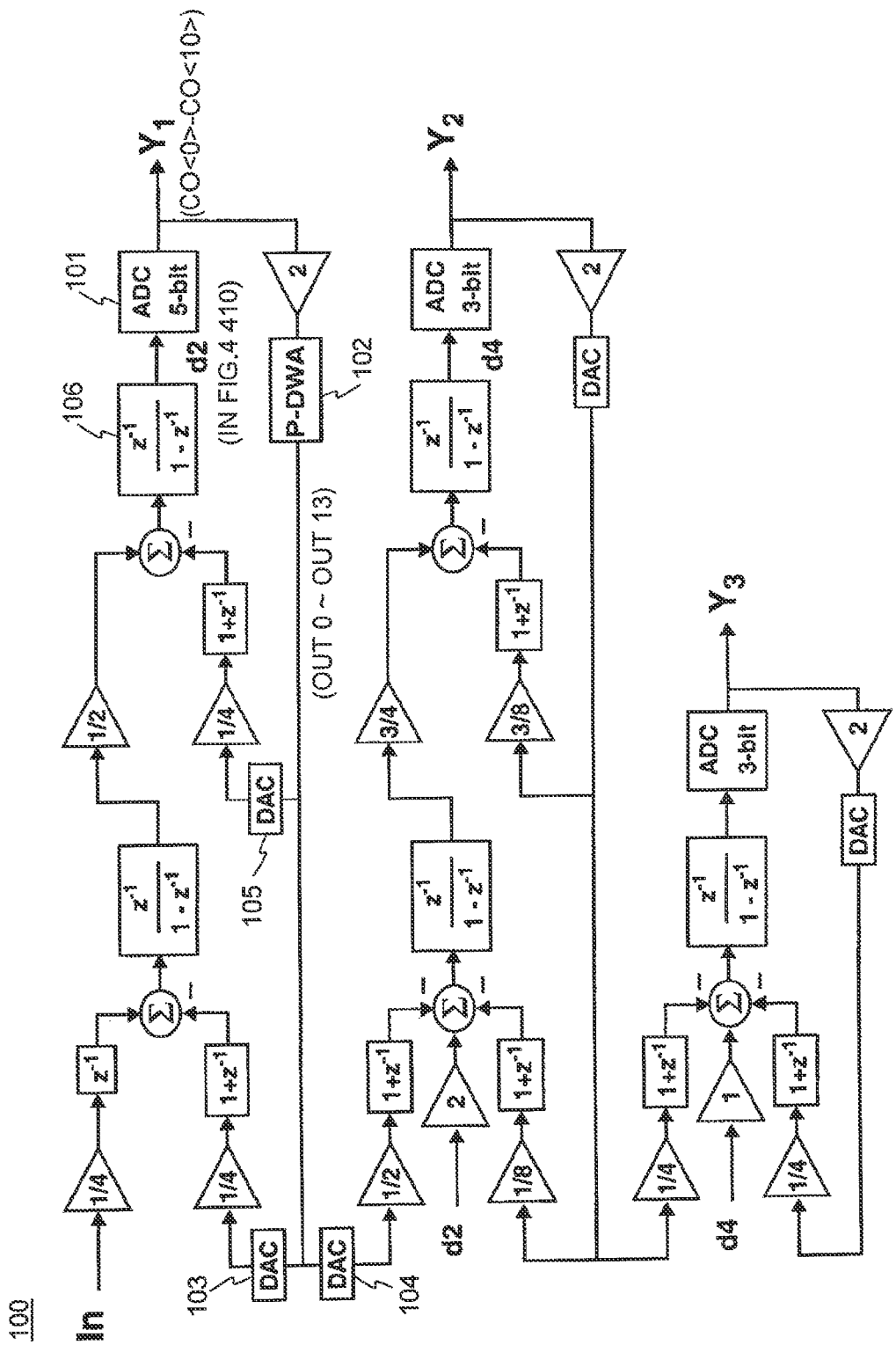
FIG. 1 is a linearized block diagram of a 2-2-1 cascaded sigma-delta modulator.
Figure 2:
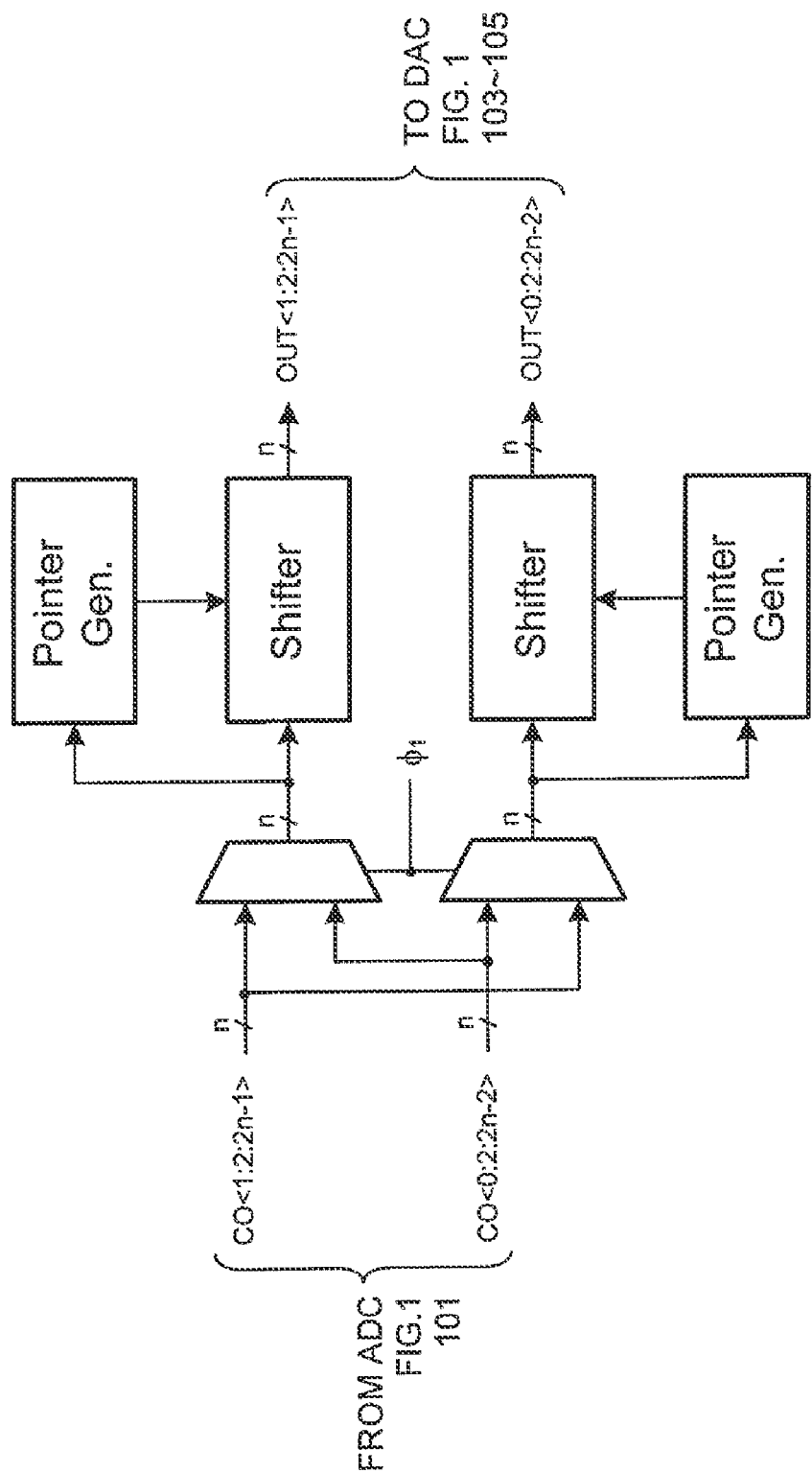
FIG. 2 is a shifter-based DWA block diagram.
Figure 3:
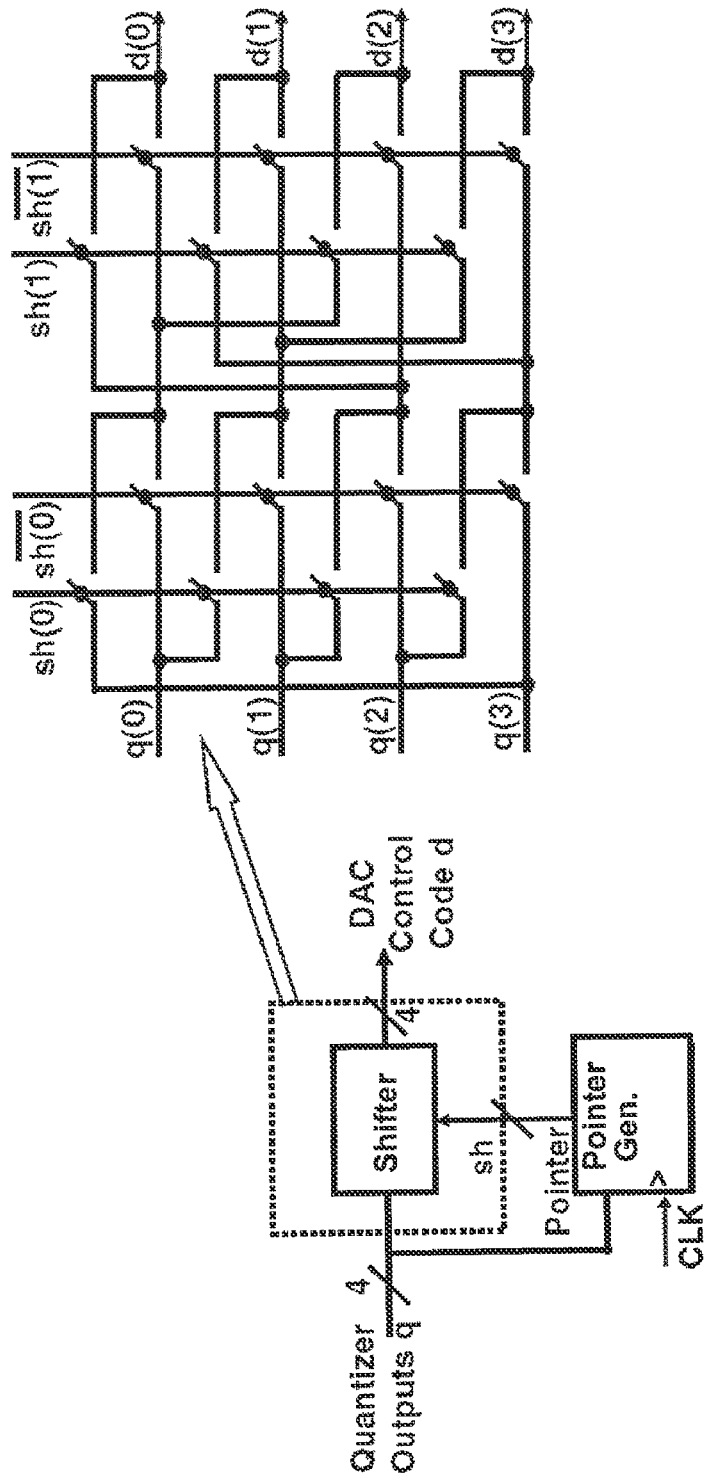
FIG. 3 is a shifter-based DWA circuit implementation.
Figure 4:
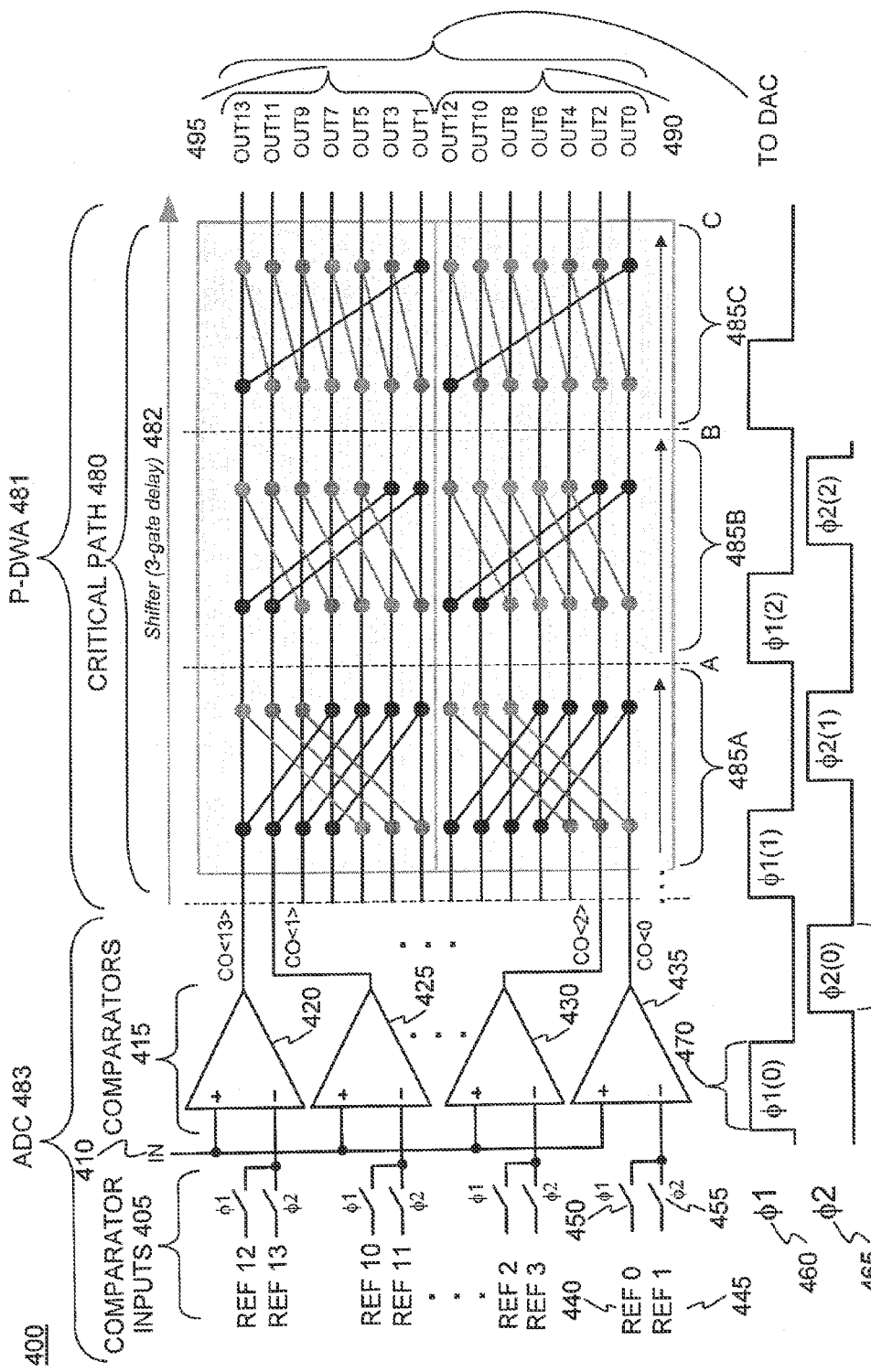
FIG. 4 is a diagram illustrating a fast data weighted average architecture and timing diagram configured in accordance with one embodiment of the present invention.

FIG. 4 is a circuit diagram illustrating a fast data weighted average architecture 400 and timing diagram configured in accordance with an embodiment of the invention. Components comprise comparator inputs 405, input IN 410, and comparators 415, some particularly are 420-435. Reference inputs 405 for comparator 435 are REF0 440 and REF1 445. Further reference inputs are REF2-REF13. REF0 440 is applied to negative input of comparator 435 through φ1 switch 450. REF1 445 is applied to negative input of comparator 435 through φ2 switch 455. Input IN 410 is applied from integrator 106 in FIG. 1. Analog-to-digital converter (ADC) 483 as quantizer comprises comparators 415. The timing diagram depicts φ1 signal 460 and φ2 signal 465. Timing signals for φ1 470 and for φ2 475, are non-overlapping. Outputs CO<0>-CO<13> of comparators 420-435 follow critical path 480 possessing 3-gate delays 485A, 485B, and 285C leading to even outputs OUT0-OUT12 490 and odd outputs OUT1-OUT13 495. P-DWA 481 comprises shifter 482 with critical path 480. P-DWA 481 is a shifter based DWA. Shifter 482 comprises a plurality of switches and rotates each input to the proper position through the binary-weighted control code. P-DWA 481 shifts outputs CO<0>-CO <13> with 3-gate delays 485A, 485B, 485C based on timing signal φ1 460 and φ2 465, and selects paths randomly based on a P-DWA algorithm. In phase φ1 (when φ1 signal is high), comparators 415 compare input IN 410 and odd reference inputs REF0-REF 12 and provide outputs CO<0>-CO<13> to P-DWA 481, and outputs CO<0>-CO<13> are shifted with 1-gate delay 485A and held. With the same timing, outputs CO<0>-CO<13> are shifted with 1-gate delay 485A in last phase φ2 are shifted with 1-gate delay 485B and held. At the same time, P-DWA 481 outputs even outputs OUT0-OUT12 490 and odd outputs OUT1-OUT13 495 with 3-gate delays 485A, 485B, and 485C provided in last phase φ1 to DAC 103 (or 104, 105).

In phase φ2 (when φ2 signal is high), comparators 415 compares input IN 410 and even reference inputs REF1-REF 13 and provides outputs CO<0>-CO<13> to P-DWA 481, and outputs CO<0>-CO<13> are shifted with 1-gate delay 485A and held. With the same timing, outputs CO<0>-CO<13> are shifted with 1-gate delay 485A in last phase φ1 are shifted with 1-gate delay 485B and held. At the same time, P-DWA 481 outputs even outputs OUT0-OUT12 490 and odd outputs OUT1-OUT13 495 with 3-gate delays 485A, 485B, and 485C provided in last phase φ2 to DAC 103 (or 104, 105).

In the next phase φ1, comparators 415 compares next input IN 410 and odd reference inputs REF0-REF12 and provides outputs CO<0>-CO<13> to P-DWA 481, and outputs CO<0>-CO<13> are shifted with 1-gate delay 485A and held. At the same time, outputs CO<0>-CO<13> are shifted with 1-gate delay 485A in last phase φ2 are shifted with 1-gate delay 485B and held. At the same time, P-DWA 481 outputs even outputs OUT0-OUT12 490 and odd outputs OUT1-OUT13 495 with 3-gate delays 485A, 485B, and 485C provided in the last phase φ1 to DAC 103 (or 104, 105).

TABLE 1

| | TIMING | | | | |
|---|---|---|---|---|---|
| A data | even D0 | odd D1 | D2 | | |
| B data | (shift) | D0 | D1 | D2 | |
| Output C data | | (shift) | D0 | D1 | D2 |

With double sampling, quantization and DEM are accomplished within non-overlap time. By reducing their time delay, analog integrator power can be reduced. By alternating two blocks, the DC normally generated by P-DWA is removed, and since this alternation is performed at the comparator in puts, there is no additional delay.

Figure 5:
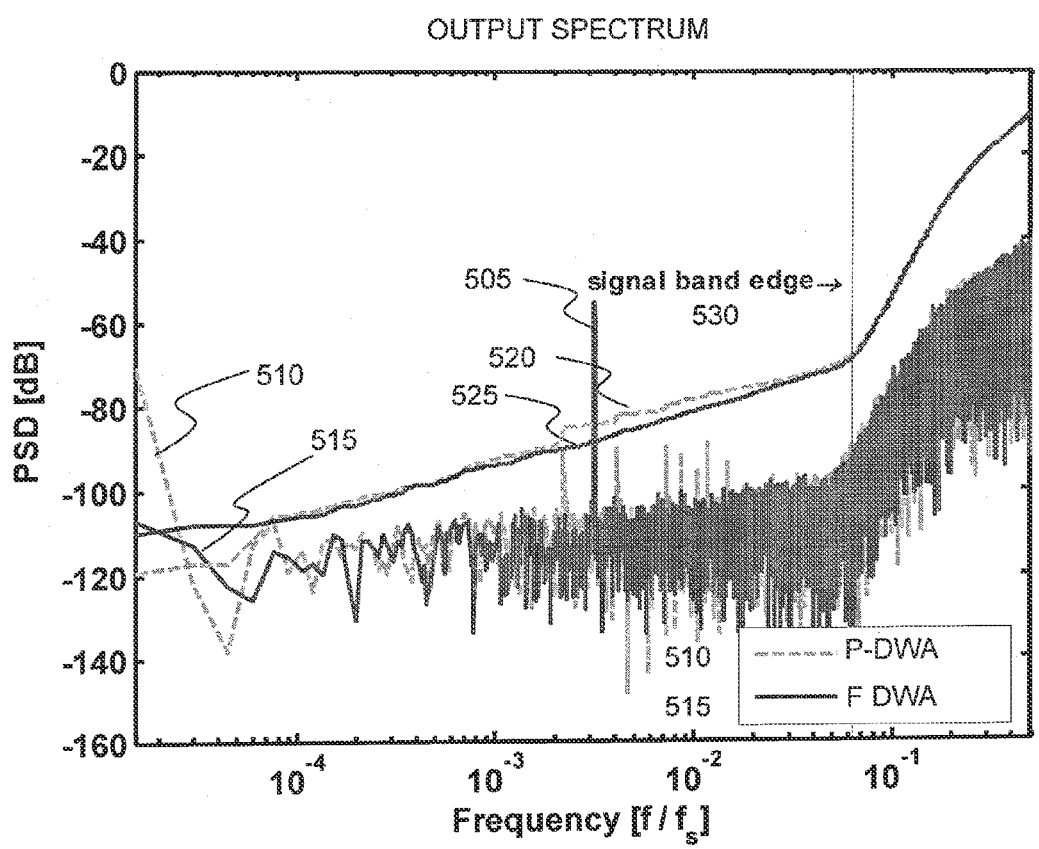
FIG. 5 is a graph of output spectrum simulation results configured in accordance with one embodiment of the present invention.

FIG. 5 is a graph 500 of MATLAB® simulation results configured in accordance with an embodiment of the invention. MATLAB® is a registered trademark of The Mathworks Inc., Corporation. To compare the performance of the fast data weighted average (F DWA) invention with conventional data weighted average (DWA) and partitioned data weighted average (P-DWA), the output power spectral densities (PSD)s of ΔΣ modulators employing the different approaches were modeled. Conditions comprise a −55 dBFS input sine wave 505, an OSR of 8, a 10-bit DAC error mismatch, 15-level quantizer, and 65,536 data points. Results displayed are P-DWA 510, and F DWA 515. Integrated noises are 520 and 525, respectively. Signal band edge 530 is also shown. For P-DWA, the spurious-free dynamic range (SFDR) equals 35.8 dB, and for this embodiment, F DWA, the SFDR equals 40.1 dB. The approach eliminates DC value and tones generated by the first-order-shaping DWA.

Figure 6:
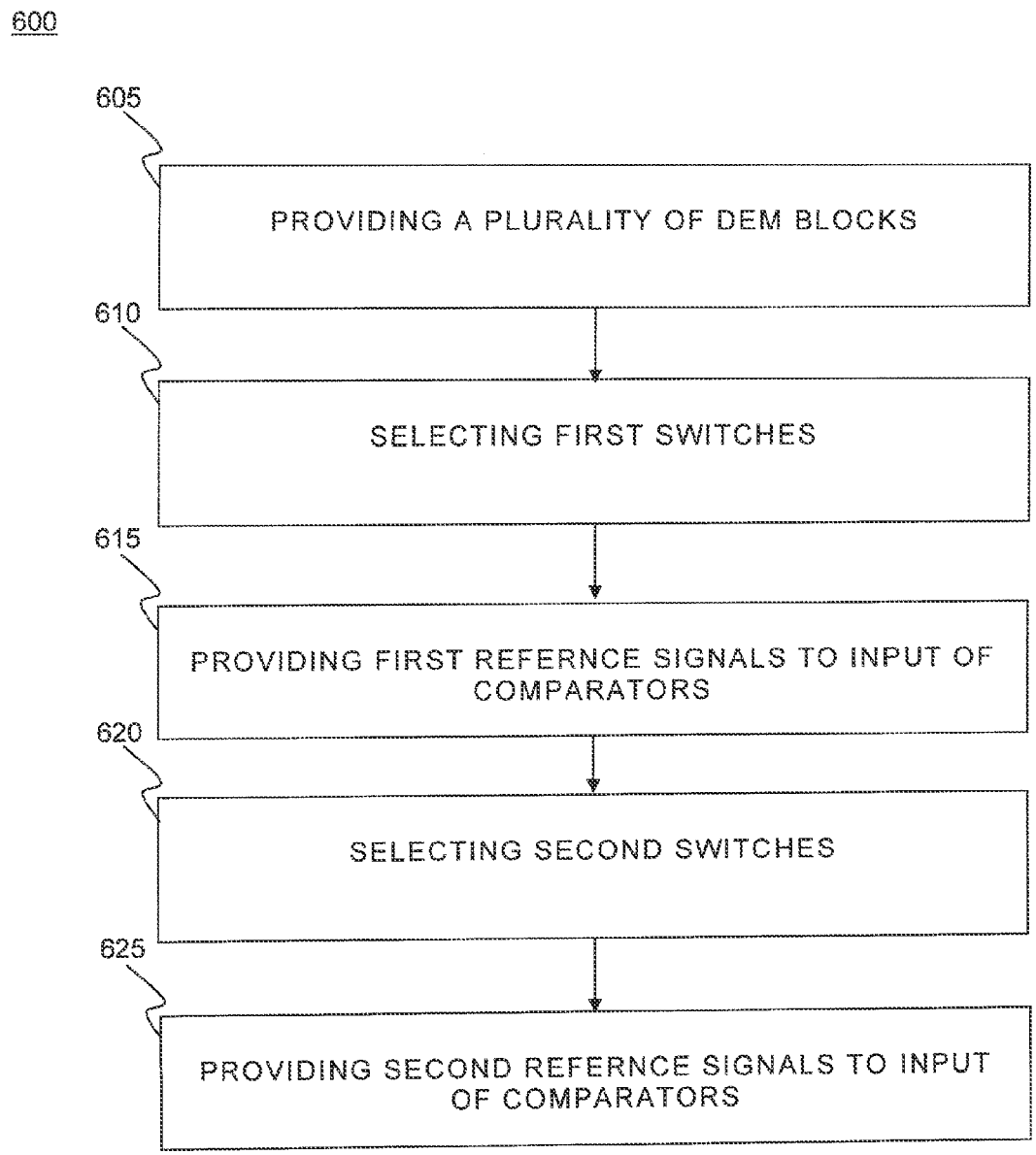
FIG. 6 is a flow chart depicting operation steps of a method configured in accordance with one embodiment of the present invention.

FIG. 6 is a flow chart 600 depicting an embodiment of a fast data weighted average method. The method steps comprise providing a plurality of DEM blocks 605; selecting first switches 610; providing input of first reference voltages to comparators 615; selecting second switches 620; and providing input of second reference voltages to comparators 625; wherein non-overlap alternation of double sampling quantization and DEM removes DC components, and maintains stability without introducing additional phase for the loop delay.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

What is claimed is:

1. A fast data weighted average circuit device comprising:
   an analog-to-digital converter (ADC) comprising a plurality of comparators; and
   a data weighted average circuit comprising a shifter;
   wherein at least one of said plurality of comparators comprises an input signal and at least two switches per said at least one comparator, said at least two switches selecting between signals of at least a first block providing first reference voltages and signals of at least a second block providing second reference voltages as inputs to said plurality of comparators, based on a timing signal;
   wherein said shifter shifts said outputs of said plurality of comparators with n-gate delays, based on said timing signal, wherein said outputs of said plurality of comparators randomly direct to a plurality of outputs; and
   wherein non-overlap alternation of said signals of said at least a first block and said at least a second block comprises double sampling quantization.

2. The fast data weighted average circuit device of claim 1, wherein said shifter comprises:
   shifting said outputs of said plurality of comparators with 3-gate delays.

3. The fast data weighted average circuit device of claim 1, wherein said outputs of said plurality of comparators randomly direct to a plurality of even outputs and a plurality of odd outputs.

4. The fast data weighted average circuit device of claim 1, wherein said timing signal comprises φ1 and φ2.

5. The fast data weighted average circuit device of claim 1, wherein said outputs of said plurality of comparators randomly direct to a plurality of outputs based on a Partitioned-Data Weighted Average (P-DWA) algorithm.

6. The fast data weighted average circuit device of claim 1, wherein said shifter comprises a plurality of switches.

7. The fast data weighted average circuit device of claim 6, wherein said shifter rotates each said comparator input to a proper position through a binary-weighted control code and selects paths randomly based on a P-DWA algorithm.

8. A delta sigma modulator comprising:
   an integrator;
   a fast data weighted average circuit device; and
   a digital-to-analog converter (DAC);

wherein said fast data weighted average circuit device comprises an analog-to-digital converter (ADC) comprising a plurality of comparators; a data weighted average circuit comprising a shifter;

wherein said comparator comprises an input signal from said integrator and at least two switches per said comparator, said switches selecting between signals of at least a first block providing first reference voltages and signals of at least a second block providing second reference voltages as inputs to said plurality of comparators, based on timing signal;

wherein said shifter shifts said outputs of said plurality of comparators with n-gate delays, based on said timing signal, wherein said outputs of said plurality of comparators randomly direct to a plurality of outputs, wherein said plurality of outputs provided to said DAC, and wherein non-overlap alternation of said signals of said at least a first block and said at least a second block with double sampling quantization.

9. A fast data weighted average circuit device comprising:
at least two switches per comparator, selecting between signals of at least a first block and signals of at least a second block providing reference voltages as inputs to a plurality of said comparators; and
a critical path comprising a three-gate delay, whereby outputs of said plurality of comparators direct to a plurality of outputs, whereby non-overlap alternation of said signals of said at least a first block and said at least a second block with double sampling quantization and Dynamic Element Matching (DEM) removes DC components and maintains stability without introducing additional phase for the loop delay.

10. The fast data weighted average circuit device of claim 9, wherein said outputs of said plurality of comparators randomly direct to a plurality of even outputs and a plurality of odd outputs.

11. The fast data weighted average circuit device of claim 9, wherein a timing signal comprises $\phi1$ and $\phi2$.

12. The fast data weighted average circuit device of claim 9, wherein said outputs of said plurality of comparators randomly direct to a plurality of outputs based on a Partitioned-Data Weighted Average (P-DWA) algorithm.

13. The fast data weighted average circuit device of claim 9, wherein a shifter comprises a plurality of switches.

14. The fast data weighted average circuit device of claim 13, wherein said shifter rotates each said comparator input to a proper position through a binary-weighted control code and selects paths randomly based on a Partitioned-Data Weighted Average (P-DWA) algorithm.

15. A method for fast data weighted average in a delta sigma modulator, said method comprising the steps of:
selecting at least a first block;
providing signal of said at least a first block to input of comparators;
selecting at least a second block; and
providing signal of said at least a second block to input of said comparators, wherein non-overlap alternation of double sampling quantization and Dynamic Element Matching (DEM) removes DC components and maintains stability without introducing additional phase for the loop delay.

16. The fast data weighted average method of claim 15, wherein said method comprises the step of:
shifting, by a shifter, outputs of said comparators with 3-gate delays.

17. The fast data weighted average method of claim 15, wherein said method comprises the step of:
randomly directing outputs of said comparators to a plurality of even outputs and a plurality of odd outputs.

18. The fast data weighted average method of claim 15, wherein said method comprises:
a timing signal comprising $\phi1$ and $\phi2$.

19. The fast data weighted average method of claim 15, wherein said method comprises the step of:
randomly directing outputs of said comparators to a plurality of outputs based on a Partitioned-Data Weighted Average (P-DWA) algorithm.

20. The fast data weighted average method of claim 15, wherein said method comprises the step of:
rotating each said comparator input by a shifter to a proper position through a binary-weighted control code; and
selecting paths randomly based on a partitioned-data weighted average (P-DWA) algorithm.

* * * * *